(12) United States Patent
Pensala et al.

(10) Patent No.: US 12,021,508 B2
(45) Date of Patent: *Jun. 25, 2024

(54) LOW LOSS ACOUSTIC DEVICE

(71) Applicant: VTT Technical Research Centre of Finland Ltd, Espoo (FI)

(72) Inventors: Tuomas Pensala, Espoo (FI); Tapani Makkonen, Espoo (FI)

(73) Assignee: VTT Technical Research Centre of Finland Ltd, Espoo (FI)

( * ) Notice: Subject to any disclaimer, the term of this patent is extended or adjusted under 35 U.S.C. 154(b) by 414 days.

This patent is subject to a terminal disclaimer.

(21) Appl. No.: 17/483,355

(22) Filed: Sep. 23, 2021

(65) Prior Publication Data

US 2022/0094333 A1 Mar. 24, 2022

Related U.S. Application Data

(63) Continuation of application No. 16/271,398, filed on Feb. 8, 2019, now Pat. No. 11,146,241.

(51) Int. Cl.
*H03H 9/54* (2006.01)
*H03H 3/02* (2006.01)
(Continued)

(52) U.S. Cl.
CPC ............... *H03H 9/54* (2013.01); *H03H 3/02* (2013.01); *H03H 9/13* (2013.01); *H03H 9/17* (2013.01);
(Continued)

(58) Field of Classification Search
CPC .. H03H 9/54; H03H 3/02; H03H 9/13; H03H 9/17; H03H 9/02086; H03H 9/02818
(Continued)

(56) References Cited

U.S. PATENT DOCUMENTS 8,149,500 B2 4/2012 Godshalk et al.
10,177,732 B2 * 1/2019 Yokoyama ............. H03H 9/173
(Continued)

FOREIGN PATENT DOCUMENTS

DE 102017117870 12/2018
WO WO 2012/049372 4/2012
WO WO 2013/068652 5/2013

OTHER PUBLICATIONS

Kokkonen et.al., "Measurement of Dispersion Properties of Active and Surrounding Regions in BAW Resonator", published in 2011 IEEE International Ultrasonics Symposium. (Year: 2011).*

(Continued)

*Primary Examiner* — Hafizur Rahman
(74) *Attorney, Agent, or Firm* — Fish & Richardson P.C.

(57) ABSTRACT

Acoustic wave devices are disclosed. The devices include a substrate, a bi-layer reflector and an acoustic wave resonator. The bi-electric reflector is above the substrate and includes a first layer that has a first acoustic impedance, and a second layer that has a second acoustic impedance lower than the first acoustic impedance. The first layer has a first surface that includes a floating region that provides a ceiling of a cavity. The second layer is on top of the floating region of the first layer. The acoustic wave resonator is on top of the second layer of the bi-layer reflector. The acoustic wave resonator includes a piezoelectric layer, an electrode and a counter-electrode such that application of a radio frequency voltage between the electrode and the counter-electrode creates acoustic resonance waves in the piezoelectric layer.

20 Claims, 9 Drawing Sheets

(51) Int. Cl.
  H03H 9/13 (2006.01)
  H03H 9/17 (2006.01)
  H03H 9/02 (2006.01)
(52) U.S. Cl.
  CPC ..... *H03H 9/02086* (2013.01); *H03H 9/02818* (2013.01)
(58) Field of Classification Search
  USPC .......................................................... 333/186
  See application file for complete search history.

(56) References Cited

U.S. PATENT DOCUMENTS

| | | | |
|---|---|---|---|
| 11,146,241 B2* | 10/2021 | Pensala | H03H 9/173 |
| 2003/0094431 A1 | 5/2003 | Shing et al. | |
| 2008/0084136 A1 | 4/2008 | Schmidhammer | |
| 2011/0315654 A1 | 12/2011 | Vanhelmont et al. | |
| 2012/0056694 A1 | 3/2012 | Pang et al. | |
| 2013/0181579 A1 | 7/2013 | Shin et al. | |
| 2013/0278356 A1 | 10/2013 | Melatus et al. | |
| 2014/0159548 A1 | 6/2014 | Burak et al. | |
| 2014/0312994 A1 | 10/2014 | Melatus et al. | |
| 2015/0280100 A1 | 10/2015 | Burak et al. | |
| 2016/0079958 A1 | 3/2016 | Burak | |
| 2019/0348966 A1 | 11/2019 | Campanella-Pineda et al. | |

OTHER PUBLICATIONS

Zhang et al., "Modeling and Analysis of Lateral Propagation of Surface Acoustic Waves Including Coupling Between Different Waves", IEEE Transactions On Ultrasonics, Ferroelectrics, and Frequency Control, vol. 64, No. 9, Sep. 2017 (Year: 2017).*

Telschow et al., "Determination of Lateral Mode Dispersion from Full-field Imaging of Film Bulk Acoustic Resonator Motion" published in the 2003 IEEE Ultrasonics Symposium (Year: 2003).* azom.com [online], "Silica—Silicon Dioxide (Si02)," Dec. 13, 2001, retrieved on Apr. 8, 2020, retrieved from URL<https://www.azom.com/article.aspx? ArticleID=1114>, 6 pages.

Bensky, "Signal generation and transmitters," Short-range Wireless Communication (Third Edition), Aug. 1, 2019, 4 pages.

Campanella-Pineda et al. "Dual MEMS Resonator Structure for Temperature Sensor Applications", IEEE Transactions on Electron Devices, Aug. 2017, 64(8):3368-3376.

Fattinger et al., "Optimization of acoustic dispersion for high performance thin film BAW resonators," Proc. IEEE International Ultrasonics Symposium, Sep. 2005, pp. 1175-1178.

International Preliminary Report on Patentability in International Appln. No. PCT/EP2020/053091, dated Aug. 19, 2021, 14 pages.

International Search Report and Written Opinion in International Appln. No. PCT/EP2020/053091, dated Jul. 24, 2020, 21 pages.

Meltaus et al., "Laterally Coupled BAW Filter using Two Acoustic Modes," Proc. IEEE Interntl. Ultrasonics Symposium, Jul. 2013, pp. 232-235.

Meltaus et al., "Laterally Coupled BAW Filters with 5% Bandwidth," Proc. IEEE International Ultrasonics Symposium, Oct. 2010, pp. 966-969.

Meltaus et al., "Laterally coupled solidly mounted BAW resonators at 1.9 GHZ," Proc. IEEE International Ultrasonics Symposium, Sep. 2009, pp. 847-850.

ondacorp.com [online], "Acoustic properties of Solids," Apr. 11, 2003, retrieved on Apr. 8, 2020, retrieved from URL<https://www.ondacorp.com/images/Solids.pdf>, 7 pages.

Pang et al., "Micromachined Acoustic Wave Resonator Isolated from Substrate," IEEE transactions on Ultrasonics, ferroelectrics, and frequency control, Aug. 2005, 52(8):1239-1246.

Pensala et al., "2-D Modeling of Laterally Acoustically Coupled Thin Film Bulk Acoustic Wave Resonator Filters," IEEE Transactions on Ultrasonics, ferroelectrics, and frequency control, Nov. 2010, 57(11):2537-49.

Properties of Materials, 2nd ed., Newnham, Jan. 27, 2005, pp. 261-262.

RF Filter Technologies For Dummies, Qorvo Special Edition, Miller, 2015, pp. 14-15.

Takai et al., "I.H.P.SAW Technology and its Application to Microacoustic Components (Invited)," 2017 IEEE, Sep. 2017, 8 pages.

Tirado, "Bulk Acoustic Wave Resonators and their Application to Microwave Devices," Thesis for the degree of Doctor of Philosophy, Universitat Autononna de Barcelona, Jun. 9, 2010, pp. 7-8.

Wang et al., "FBAR Laterally Coupled Resonator Filter", 2015 IEEE International Ultrasonics Symposium Proceedings, Oct. 2015, 5 pages.

* cited by examiner

LOW LOSS ACOUSTIC DEVICE

CROSS-REFERENCE TO RELATED APPLICATION

This application is a continuation of and claims priority to U.S. patent application Ser. No. 16/271,398, filed on Feb. 8, 2019. The disclosure of the prior application is considered part of and are incorporated by reference in the disclosure of this application.

BACKGROUND

Technical Field

This specification relates to thin film radio-frequency acoustic wave filters.

Background

Radio-frequency ("RF") components, such as resonators and filters, based on micro-acoustic and thin-film technology are widely used in radio applications such as: mobile phones, wireless networks, satellite positioning, etc. Their advantages over their lumped-element, ceramic, and electromagnetic counterparts include small size and mass-production capability.

Micro-acoustic devices such as filters and resonators suffer from a variety of losses such as electrical losses (such as resistive losses, dielectric losses, or mismatch losses), viscous losses, and acoustic losses. Reducing the losses in an acoustic device can improve the functionality of the device.

Acoustic losses of an acoustic structure include acoustic radiation and leakage from the acoustic structure along the surface of the structure (referred to as "horizontal losses" herein) and through the structure (referred to as "vertical losses" herein). The horizontal losses can include outgoing surface waves along the surface of the structure, Lamb wave modes along a layered film structure, guided wave propagation along interfaces of different materials in the structure, etc. The vertical losses include the outgoing acoustic waves through the acoustic structure, for example, to a substrate that holds the acoustic structure.

SUMMARY

The present disclosure provides techniques to reduce the acoustic loss in micro-acoustic resonators. The present techniques include forming an acoustic wave device that has a bi-layer reflector formed in a substantial vicinity of a micro-acoustic resonator (e.g., BAW, SAW, LBAW, etc.). The bi-layer reflector reflects the acoustic energy that escape from the resonator, back into the resonator, as well as, modifies the acoustic dispersion of the resonator. The reflector also ensures high effective electromechanical coupling coefficient $K^2$ of the device. The device can also include one or more trenches or gaps to reduce the wave propagation to the resonator's surroundings and further reduce the acoustic loss. The trenches may extend vertically and/or horizontally.

The acoustic wave devices described herein include a substrate, a bi-layer reflector and an acoustic wave resonator. The bi-electric reflector is above the substrate and includes a first layer that has a first acoustic impedance, and a second layer that has a second acoustic impedance lower than the first acoustic impedance. The first layer has a first surface that includes a floating region that provides a ceiling of a cavity. The second layer is on top of the floating region of the first layer. The acoustic wave resonator is on top of the second layer of the bi-layer reflector. The acoustic wave resonator includes a piezoelectric layer, an electrode and a counter-electrode such that application of a radio frequency voltage between the electrode and the counter-electrode creates acoustic resonance waves in the piezoelectric layer The foregoing and other embodiments can each optionally include one or more of the following features, alone or in combination.

The first surface of the first layer can further include a supported region that is on the substrate. The first layer can be indirectly supported by the substrate. In some embodiments, the first layer is acoustically isolated from the substrate.

The bi-layer reflector may be configured to reflects at least part of the acoustic resonance waves that propagated out of the piezoelectric layer back to the acoustic wave resonator. The cavity may block propagation of at least part of the acoustic resonance waves to the substrate. In some implementations, the bi-layer reflector is configured to reflect back acoustic waves that have frequencies greater than a cutoff frequency of a passband of the acoustic wave resonator. In some implementations, the cavity completely blocks propagation of a portion of the acoustic response waves that are propagated from the acoustic wave resonator towards the cavity.

Some embodiments include one or more trenches in the piezoelectric layer and positioned laterally outward of the electrodes of the resonator, the one or more trenches are configured to reflect at least part of the acoustic resonance waves that have laterally propagated out of the piezoelectric layer.

The acoustic wave resonator can be selected from the group consisting of a bulk acoustic wave (BAW) resonator, a surface acoustic wave (SAW) resonator, a lateral bulk acoustic wave (LBAW) resonator, and a Lamb wave resonator. In some embodiments, the device has a monotonic dispersion behavior such that a lateral wave number of the device increases monotonically as a function of the frequency.

The piezoelectric layer can include AlN, ScAlN, LiTaO3, LiNbO3, ZnO, and/or GaN. The first layer can include W, Mo, Ir, Al2O3, diamond, Pt, AlN, and Si3N4, or Os (Osmium). The second layer can include SiO2, glass, Al, Ti, C, or a polymer-based material.

In some embodiments, the second acoustic impedance is 60% to 90% lower than the first acoustic impedance. In some embodiments, the first acoustic impedance of the first layer is greater than 20 e6 kg/m²s.

In some embodiments, at least one of the electrode and the counter-electrode includes an interdigited transducer structure. In some embodiments, the piezoelectric layer is sandwiched between the electrode and the counter-electrodes.

Another innovative aspect of the subject matter described in this specification can be embodied in a method of fabricating an acoustic wave filter. The method includes depositing an intermediary layer on top of a substrate, forming a first layer on top of the intermediary layer, forming a second layer on top of the first layer, forming an acoustic wave resonator on top of the second layer, and removing the intermediary layer to form a gap between the first layer and the substrate layer such that the gap blocks propagation of at least part of the acoustic resonance waves out of the acoustic wave resonator to the substrate. The first layer has a first acoustic impedance. The second layer has a second acoustic impedance that is lower than the first acoustic impedance. The acoustic wave resonator includes a piezoelectric layer, an electrode and a counter-electrode such that application of a radio frequency voltage between the electrode and the counter-electrode creates acoustic resonance waves in the piezoelectric layer.

The foregoing and other embodiments can each optionally include one or more of the following features, alone or in combination. Removing the intermediary layer can include etching the intermediate layer. The method can further include forming one or more release vents that pass through the acoustic wave resonator, the second layer, and the first layer, wherein the intermediary layer is etched through the one or more release vents. The first and the second layers can be configured to reflect back acoustic waves that have frequencies greater than a cutoff frequency of the acoustic wave resonator.

Another innovative aspect of the subject matter described in this specification can be embodied in another method of fabricating an acoustic wave filter. The method includes forming a first layer on top of a substrate such that the first layer covers a first region of the substrate, forming a second layer on top of the first layer, forming an acoustic wave resonator on top of the second layer, the acoustic wave resonator, and removing at least part of the first region of the substrate that is covered by the first layer to form a gap between the first layer and the substrate. The first layer has a first acoustic impedance. The second layer has a second acoustic impedance that is lower than the first acoustic impedance. The acoustic wave resonator includes a piezoelectric layer, an electrode and a counter-electrode such that application of a radio frequency voltage between the electrode and the counter-electrode creates acoustic resonance waves in the piezoelectric layer. Removing the at least part of the first region of the substrate can include etching the at least part of the first region of the substrate.

The subject matter described in this specification can be implemented in particular embodiments so as to realize one or more of the following advantages. The present implementations provide acoustic filter devices that include one or more micro-acoustic wave resonators. The devices are designed to reduce the acoustic loss and improve the Q-value (also known as "Q-factor") of the resonator. The bi-layer reflector along with the gap between the bi-layer and the substrate reduce the acoustic loss of the resonator by reflecting the acoustic wave that escaped from the resonator, back into the resonator's structure. Such reflection reduces a leakage or dissipation of energy from the resonator, and thus, improves the Q-value of the device. The gap can completely block propagation of acoustic waves that propagate from the resonator towards the gap. In some embodiments, the gap even isolates the resonator from the substrate and blocks almost 100% of acoustic propagation into the substrate, which results in a high Q-value.

Nevertheless, if there is a lot of vibration energy outside the piezoelectric volume, where the electrical and mechanical energy convert to each other, the device may provide a weak $K^2$ value. The effective electromechanical coupling coefficient $K^2$ of a device indicates the efficiency of conversion of mechanical energy to electrical energy and vice versa through the piezoelectric effect and defines the bandwidth that can be achieved for the device. $K^2$ is determined by material properties of the piezoelectric layer, as well as by design features of the resonator. Vibrations that occur outside this piezoelectric conversion volume, e.g., in layers beneath the resonator, reduce $K^2$.

The bi-layer reflector in the present disclosure ensures high effective electromechanical coupling coefficient $K^2$ of the device. The bi-electric layer is designed to concentrate the vibration energy within the piezoelectric volume where the driving electric field is applied—i.e., between the electrodes—as well as to prevent leakage of energy.

Further, the present devices can be designed to provide a desired dispersion behavior regardless of the type of dispersion that the resonator provides. Generally, it is desired to achieve a monotonic dispersion for acoustic resonators, such as LBAW resonators. However, some piezoelectric materials that are used in resonators do not provide a monotonic dispersion. The layers of the bi-electric reflector disclosed herein can be designed to modify the dispersion of the piezoelectric layer of the resonator and provide a monotonic dispersion.

Depending on the materials that are used for the bilayer, the bilayer can improve other characteristics of the acoustic response of the device, as well. For example, using SiO2 or fluorinated SiO2 glass as the closest layer of the bi-layer to the piezoelectric volume causes a reduction in the temperature coefficient of the frequency response of the device. A low temperature coefficient of frequency improves temperature stability of the acoustic response. SiO2 exhibits an opposite sign of temperature drift than most materials and thus acts as a temperature drift compensating element. Accordingly, a bi-layer that includes a SiO2 layer as its closest layer to the piezoelectric volume of a resonator can improve stability of the passband or the resonance frequency of the device over a range of temperatures, e.g., within ambient temperatures.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Vertical losses account for a significant portion of acoustic losses in micro-acoustic devices that include micro-acoustic resonators. One way to reduce the vertical losses in a micro-acoustic device is to form a gap below the device's resonator to limit the acoustic energy within resonator. Such a gap reduces the insertion loss that is resulted from acoustic wave propagation out of the resonator, for example, to a substrate or other layers that hold the resonator. Another way to reduce the vertical losses is to form a Bragg reflector below or around the resonator. A Bragg reflector is a multi-layer interference that reflects the acoustic energy that escapes from the resonator, back into the resonator.

Embodiments of the present disclosure implement an acoustic resonator on a bi-layer reflector that includes a low acoustic impedance layer and a high acoustic impedance layer. The bi-layer reflector reflect the acoustic waves that scape from the resonator, back into the resonator to concentrate the vibration energy within the piezoelectric volume and improve the $K^2$ value. In addition, the layers of the bi-layer reflector can be used as acoustic modification layers and be designed to achieve desired acoustic dispersion properties. The bi-layer reflector is formed over a substrate. A gap is arranged between the bi-layer reflector and the substrate. The gap blocks further prevents propagation of the acoustic waves into the substrate to provide a high Q-value for the overall device. The micro-acoustic devices disclosed herein can be used as micro-acoustic resonators or filters. The terms resonator and filter may be used interchangeably throughout this disclosure with no intention to limit the functionality of either a micro-acoustic resonator or a micro-acoustic filter.

FIGS. 1A through 5 provide an overview of example micro-acoustic filters and their properties. Although these figures mostly describe lateral bulk acoustic wave (LBAW) resonators, the embodiments of this disclosure cover other micro-acoustic resonators such as the bulk acoustic wave (BAW) resonators, the surface acoustic wave (SAW) resonators, and Lamb wave resonators, as well. FIGS. 6A through 7B provide example micro-acoustic devices that reduce the acoustic loss, improve the dispersion properties, and improve the Q-value (or Q-factor) of micro-acoustic resonators.

Figure 1A:
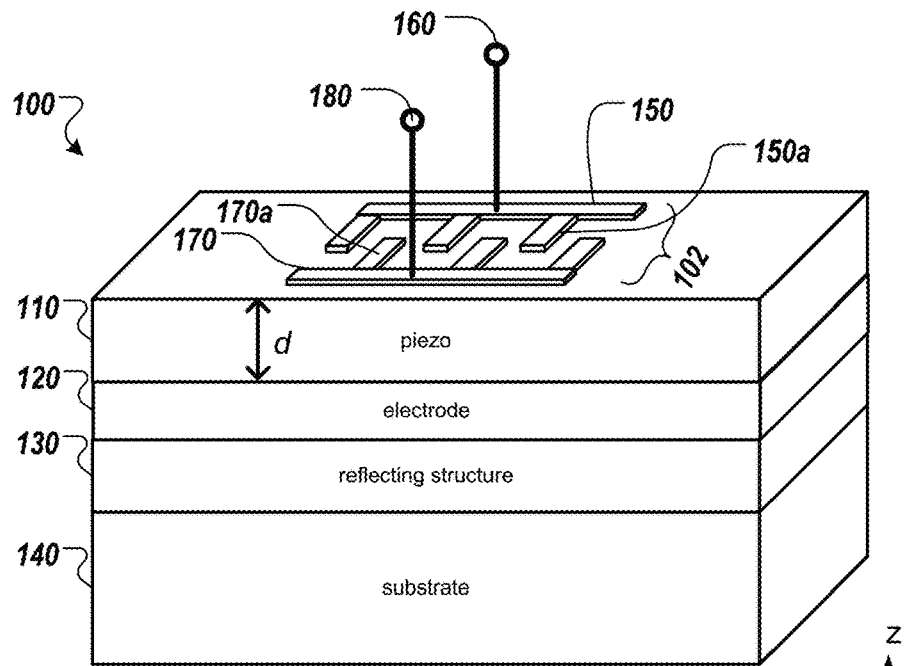
FIG. 1A is a schematic perspective view of a solidly-mounted LBAW filter.
Figure 1B:
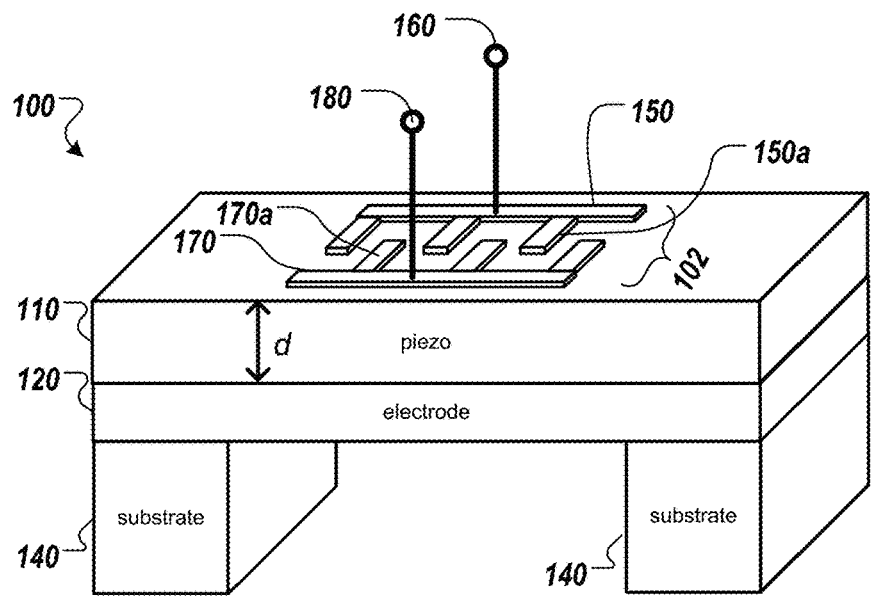
FIG. 1B is a schematic perspective view of a self-supported LBAW filter.
Figure 1C:
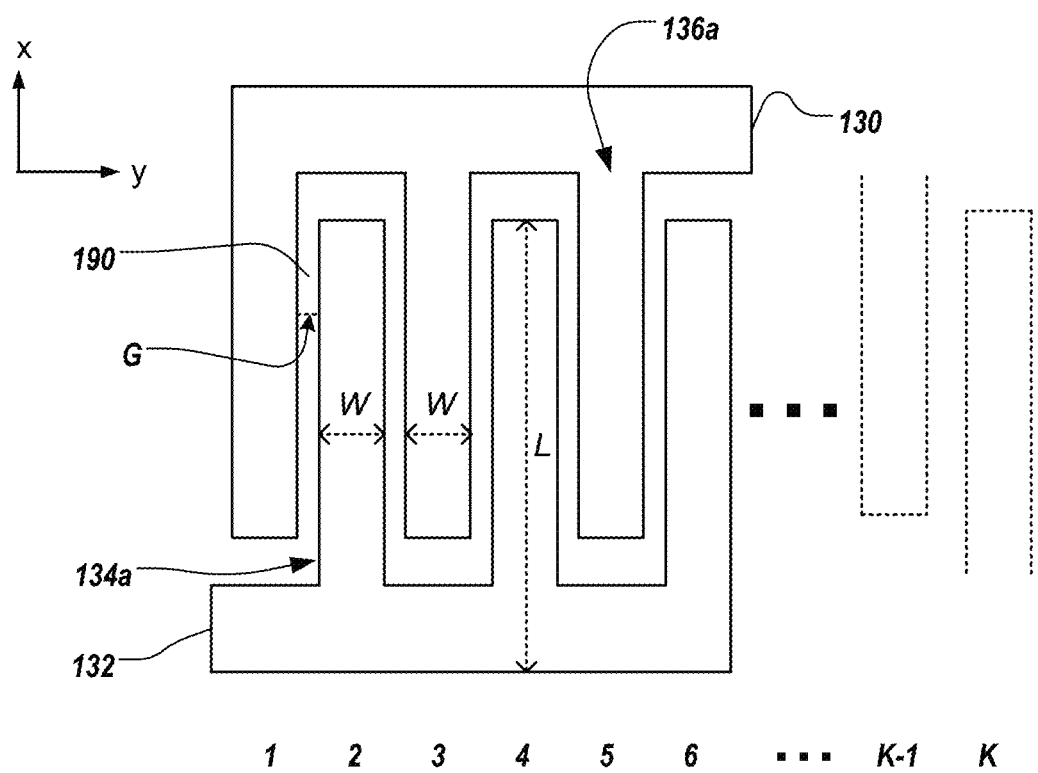
FIG. 1C is a schematic planar view of an interdigital transducer ("IDT") electrode structure.

FIGS. 1A-1C show an example of an LBAW filter (or resonator) 100 with input 150 and output 170 electrodes that have an interdigitated geometry (also called "interdigital transducer" or "IDT" LBAW). LBAW filter 100 includes a piezoelectric ("piezo") layer 110, having a thickness d, an IDT electrode structure 102 located on the top surface of the piezo layer, and a bottom counter electrode 120 located on the bottom surface of the piezo layer. IDT electrode structure ("IDT") 102 includes two comb-shaped electrodes, 150 and 170, of conductive material, e.g., metal or polysilicon. IDT electrodes 150 and 170 have parallel extensions 150a and 170a, respectively, that provide the "tines" or "teeth" or "fingers" of the "comb." Electrode 150 and counter electrode 120 form an input resonator with piezo layer 110. Electrode 170 and counter electrode 120 form an output resonator with piezo layer 110.

Acoustic vibrations are created in piezo layer 110 by applying an oscillating (or alternating) input voltage across IDT electrode 150 and bottom counter electrode 120 at an input port 160. The applied voltage is transformed into a mechanical (e.g., acoustic) vibration via the piezoelectric effect. Under resonance conditions (e.g., with certain acoustic resonance modes, as detailed further below), this vibration can create a standing wave under input electrode 150 and an evanescent wave (with exponentially decaying amplitude) in the gap region 190. With appropriate selection of vibration frequencies and gap width G, the standing wave can couple mechanically across gap 190 from the piezo region under electrode 150 to piezo region under electrode 170 and create a similar standing wave in piezo layer 110 under electrode 170. The standing wave under electrode 170 results in an output signal voltage with the same frequency at an output port 180 via the reverse piezoelectric effect. The frequency range at which this coupling occurs in mechanical resonance with strong piezoelectric coupling forms the passband (or bandwidth) of LBAW filter 100. In some example, the frequency range is between 1.8 and 1.95 GHz. As discussed further below, the thicknesses and geometries, and spacing of the various layers of LBAW 100 can be tuned to change the RF response and passband of the filter.

A reflecting structure 130 can serve to isolate the vibration in piezo layer 110 from an underlying substrate 140 and to prevent acoustic leakage. Thin layer structure can, for example, be a Bragg reflector composed of alternating high and low acoustic impedance ("$Z_{ac}$") material layers. In some embodiments, the thickness of these layers can be designed such that the frequencies with and near the passband of LBAW filter are reflected back into piezo layer 110 and all other frequencies pass through the mirror.

In some embodiments, LBAW 100 does not directly overlie substrate 140 (as shown in FIG. 1A), but is self-supported, as shown in FIG. 1B. In such arrangement, substrate 140 and mirror 130 are replaced by an air gap, with portions of piezo that extend laterally past the region in which LBAW 100 is fabricated being supported by substrate 140.

In some embodiments, as shown in FIG. 1C, extensions 150a and 170a are rectangular and have a width W, length L, and are spaced by gap width G. Each electrode 150 and 170 has one or more extensions 150a and 170a respectively. The total number of electrode extensions is designated as K.

Although FIG. 1C shows rectangular interdigital electrodes 150/170 with parallel extensions 150a/170a of same geometry and spacing G, other electrode geometries are also contemplated. Design considerations include the gap between electrodes, the length of the electrode, and the number, if any, and shape of electrode extensions. The gap can be used to control coupling between the input and output electrodes. Longer electrodes can also increase coupling. The number of extensions K can be used to control the bandwidth and/or to increase coupling while conserving the area taken up by the electrodes. In some embodiments, the electrodes are composed of rectangular strips, with two or more extensions (e.g., K≥2). For example, each extension can be a rectangular strip. In some embodiments, the electrodes are concentric circles or spirals having a common axis.

Piezo layer 110 can be formed from various piezoelectric materials. Exemplary materials include ZnO, AlN, CdS, PZT, LiNbO$_3$, LiTaO$_3$, quartz, KNN, BST, GaN, Sc alloyed AlN, or the aforementioned materials doped or alloyed with an additional element. Doping can be used to improve or tailor electromechanical properties of piezo layer 110. As detailed further below, piezo layer thickness d is selected such that thickness-extensional modes near the frequencies of the desired bandwidth of the LBAW filter are produced in the piezo layer. In some embodiments, piezo layer thickness d is 20% to 50% of $\lambda_z$, or 30% to 45% of $\lambda_z$, where $\lambda_z$ is the wavelength of the piezoelectric vibration in the thickness direction. In some embodiments, d is 1500 nm to 2500 nm, or 1800 to 2200 nm.

Thin film IDT 102 can be composed of various materials. In some embodiments, IDT electrodes 150 and 170 are metal. For example, the electrode material includes Al, Mo, Pt, Cu, Au, Ag, Ti, W, Ir, Ru, or multilayers of metals and/or metals doped with additional materials, e.g., AlSi, AlSiCu, polysilicon, etc. Doping can be used to improve or tailor IDT electric or mechanical properties.

Although FIG. 1A shows a single common counter electrode 120, filter 100 can include separate electrodes for the input and output resonators. Various materials are suitable for the counter electrode(s) (e.g., electrode 120). For example, the electrodes can include a metal, such as Al, Mo, Pt, Cu, Au, Ag, Ti, W, Ir, Ru, or multilayers of metals and/or metals doped with additional materials, e.g., AlSi, AlSiCu etc. Doping can be used to improve or tailor IDT electric or mechanical properties. For example, the electrodes can be Ti+Mo, Ti+W, AlN+Mo, or Al+W. The electrodes can be multilayered. The electrodes can have a special thin seed layer deposited below the electrode.

Reflecting structure 130 can be composed of alternating layers of different materials. For example, reflecting structure 130 can include alternating layers of two of: Tungsten (W), $SiO_2$, silicon (Si), carbon (C). For example, layers of high acoustic impedance include be W, Mo, Ir, $Al_2O_3$, diamond, Pt, AlN, $Si_3N_4$. Layers of low acoustic impedance can include $SiO_2$, glass, Al, Ti, C, polymers, or porous materials. Layer of Si provides an intermediate acoustic impedance. Various materials are suitable for the substrate 140, such as Si or $SiO_2$ or glass, sapphire, quartz. Substrate 140 materials can have high electrical resistivity. The substrate can have a thickness appropriate for RF applications, such as integration into mobile phone platforms. For example, the substrate can have a thickness less than 500 microns, or less than 200 microns. For example, Si wafers can be purchased with a thickness of 675 μm and thinned down to achieve a desired device thickness, e.g., for mobile platforms.

Modeling of the acoustic response of LBAW 100 can provide guidance on how to tune the design parameters for individual elements of the structure to achieve desired bandpass properties. For example, LBAW 100 can be designed to have resonance modes at specific frequencies. In general, the geometry of various LBAW 100 components can be selected to achieve various acoustic properties. LBAW 100 properties can depend on the combination of these geometries, which may not be independent of one another.

Figure 2A:
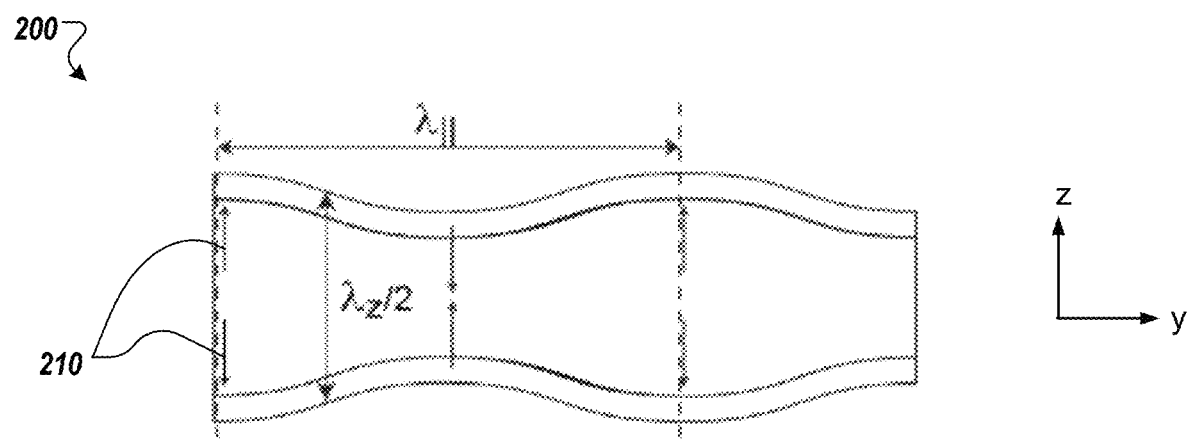
FIGS. 2A-2B are schematic diagrams of two types of propagating plate wave modes in LBAW piezo layer.
Figure 2B:
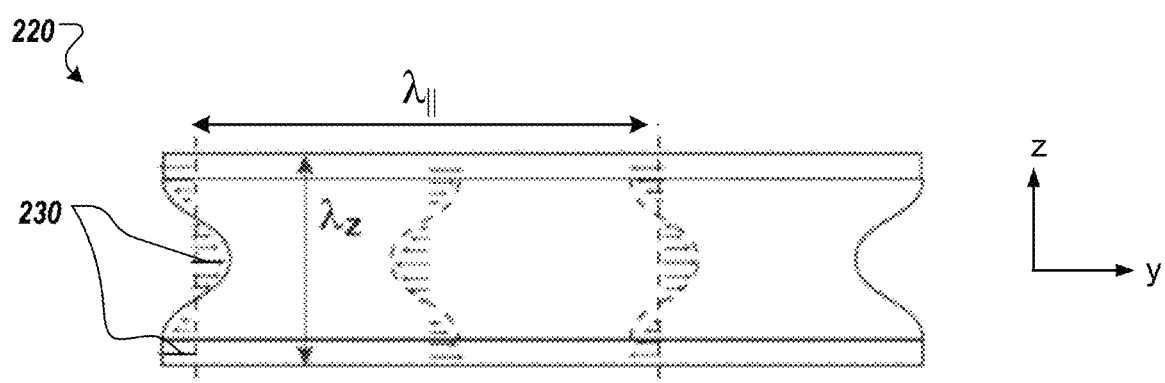

In piezoelectric layer 110, different bulk acoustic vibration modes can arise at different excitation frequencies f of input voltage (e.g., at port 160). Acoustic vibrations in piezo layer 110 can propagate laterally as Lamb waves (or plate waves), wherein particle motion lies in the plane that contains the direction of wave propagation and the plate normal (e.g., the z-axis in FIG. 1A). Two such modes are shown in FIGS. 2A-2B. Referring to FIG. 2A, a thickness-extensional (TE or longitudinal) bulk mode 200 has particle displacement 210 dominantly perpendicular to the propagation direction (in the z-direction). Referring to FIG. 2B, a second order thickness-shear (TS2) bulk mode 220 has particle displacement 230 dominantly parallel to the propagation direction (in the y-direction). For both modes, the lowest frequency at which resonance in the thickness direction can arise is when the thickness d of piezo layer 110 is equal to an integer number of half wavelengths $\lambda_z$ (disregarding the thickness of electrodes 150/170); in other words, when $$d = \frac{N\lambda_z}{2},$$

where N is an integer that indicates the order of the resonance. For the TE1 mode, $$d = \frac{\lambda_z}{2}.$$

As discussed further below, the width W of the electrodes and the gap G between electrodes can be designed such that TE1 mode standing waves with certain lateral wavelengths $\lambda_\parallel$ are formed that can couple through their evanescent tails across gap G to create two mechanical resonant modes.

Figure 3:
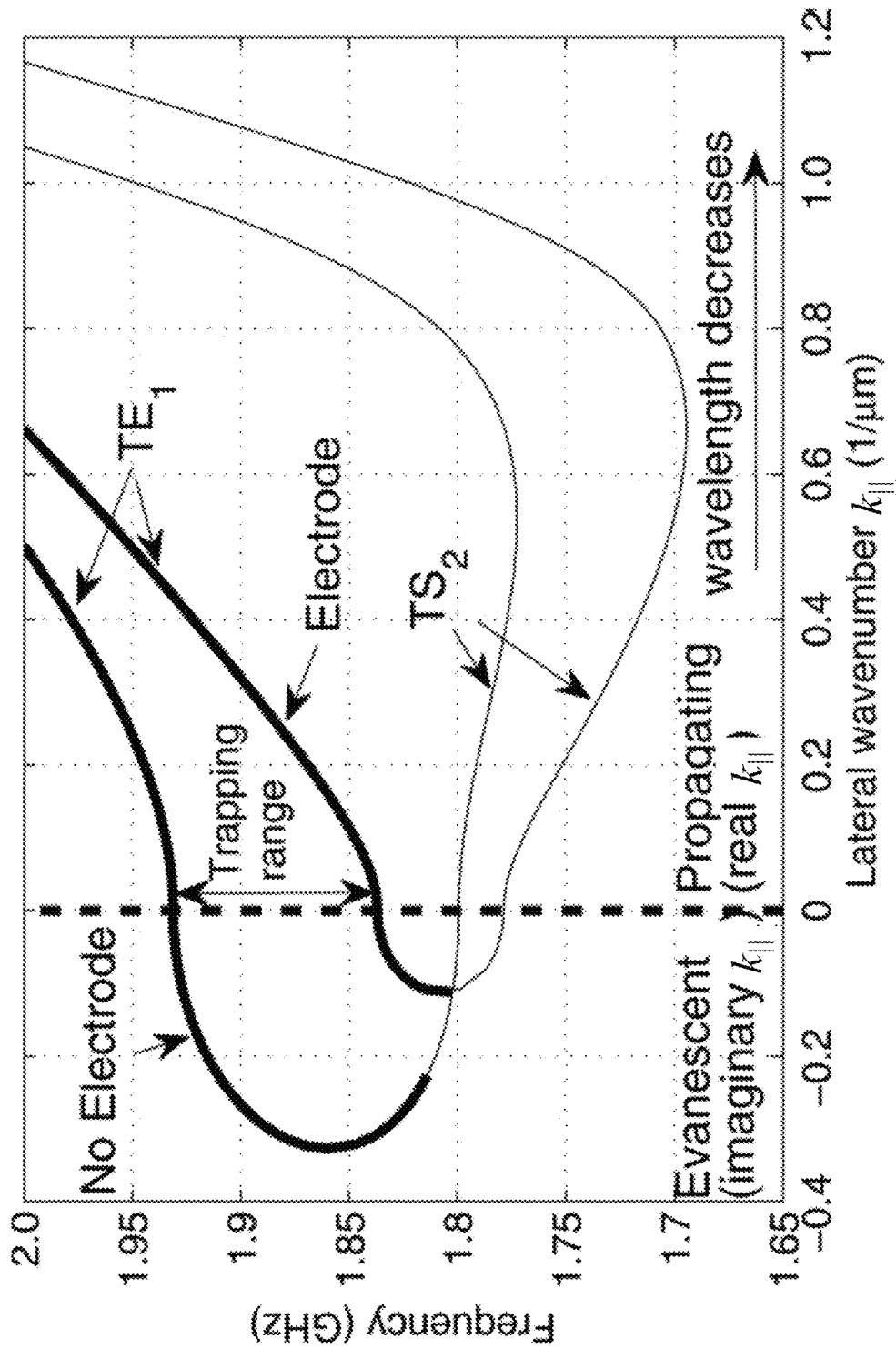
FIG. 3 is dispersion curves for an exemplary LBAW.

Acoustic properties of an LBAW resonator 100 can be described with dispersion curves. Referring to FIG. 3, an example dispersion curve for an LBAW 100 shows the lateral wave number $k_\parallel$ of the vibration, where $$k_\parallel = \frac{2\pi}{\lambda_\parallel},$$

as a function of voltage input frequency f. The first-order longitudinal (thickness extensional, TE1) vibration mode, in which the combined thickness of the piezoelectric layer d and the thickness of electrode(s) 150 or 170 contains approximately half a wavelength of the bulk vibration, $\lambda_z/2$, and the second-order thickness shear (TS2) mode, in which the bulk vibration is dominantly perpendicular to the thickness direction (z-axis in FIG. 2B) and one acoustic wavelength $\lambda_z$ is contained in the combined piezoelectric layer thickness d and the thickness of electrode(s) 150 and 170, are denoted in the figure. The TE1 mode is the darker portion of each dispersion curve, and TS2 mode is the lighter region of each dispersion curve. The top curve ("no electrode") represents the dispersion properties of the piezoelectric layer under the gap 190. The bottom curve ("electrode") represents the dispersion properties of the piezoelectric layer under electrodes 150/170, also known as the active region. More specifically, where the "electrode" curve intersects k=0, the TE1 mode has approximately $\lambda_z/2$ contained in the combined thickness of the electrodes 150 or 170 and the piezoelectric layer. This is approximate because the wave can extend into the Bragg reflector. "No Electrode" curve intersection with k=0 lines shows the modes where approximately $\lambda_z/2$ is contained in the combined thickness of the bottom electrode only and the piezolayer. This type of dispersion, in which the TE1 mode has increasing $k_\parallel$ with increasing frequency f, is called Type 1. The difference in intersect k∥=0 frequencies between electrode and non-electrode areas determined the hard limits for the achievable bandwidth of the filter. The gap width G, electrode width W, and number of extensions K can be used to vary the coupling strength within the limits set by the dispersion difference.

In some embodiments, LBAW 100 can be designed to produce Type 1 dispersion. For example, piezo layer 100 materials can be selected in which Type 1 dispersion can occur. For example, ZnO can be used. Alternatively or in addition, appropriate design of acoustic Bragg reflector 130 can help achieve Type 1 dispersion. For example, using Aluminum nitride ("AlN") for piezo layer 110 can typically produce a Type 2 dispersion, where TE1 mode behaves non-monotonically having initially decreasing $k_\parallel$ with increasing frequency f, and then increasing $k_\parallel$ with increasing frequency f, (roughly similar to what is described in the dispersion curves of in FIG. 3 but with TE1 and TS2 interchanged). However, with an appropriate design of the reflecting structure 130 (e.g., acoustic Bragg reflectors), the LBAW 100 can use AlN in piezo layer 100 and still achieve a Type 1 dispersion. See for example Fattinger et al. "Optimization of acoustic dispersion for high performance thin film BAW resonators," Proc. IEEE International Ultrasonics Symposium, 2005, pp. 416-419.

In FIG. 3, positive values of $k_\parallel$ denote real wave numbers (propagating waves) and negative $k_\parallel$ values correspond to imaginary wave numbers (evanescent waves). For a resonance to arise, the acoustic energy must be trapped inside the LBAW resonator structure. In the thickness (z-axis) direction, isolation from the substrate (using reflecting structure 130) can be used for energy trapping. In the lateral direction, energy trapping can occur when an evanescent wave forms outside the electrode region (e.g., on the "no electrode" curve). To get resonant coupling between the two resonators (e.g., electrodes 150/170 and 120) of an LBAW, standing waves of a TE1 mode form in the active regions of the piezo layer (under the electrodes), and evanescent waves form in the "no electrode" region. In other words, $k_\parallel$ is positive for the TE1 "electrode" curve and negative for the TE1 "no electrode" curve. According to FIG. 3, this occurs in the labeled "trapping range" frequency range. Energy trapping can be easier to realize in Type I dispersion. Without wishing to be bound by theory, with monotonically increasing dispersion curves as the thick TE1 lines in FIG. 3, for the "Electrode", at a single frequency in the trapping range there is either a single imaginary wave number available or above the trapping range a single real wave number. The former means that the TE1 does not propagate outside the electrode, and the latter that the TE1 can couple to a propagating wave outside the electrode and thus "leak". The Type 2 dispersion can be described by similar curves but with the TE1 and TS2 curves interchanged. The fact that the curve in Type 2 is non-monotonic means that at a given frequency there may be several real wavenumbers. Having several wavenumbers for a frequency means propagating waves are available outside the electrode, which can cause a "leak".

Figure 4A:
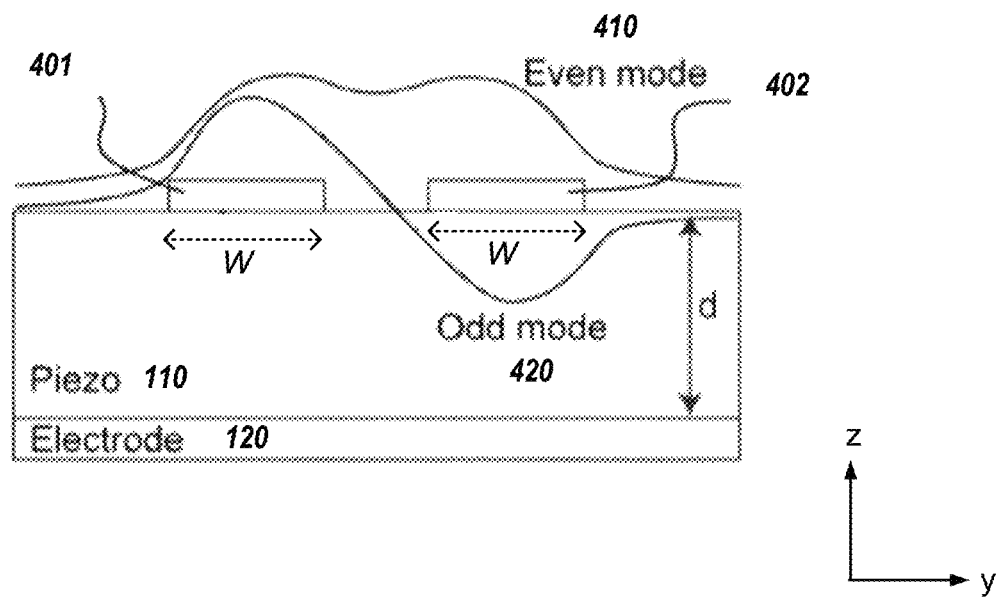
FIG. 4A is a schematic diagram of two resonant modes in an LBAW.
Figure 4B:
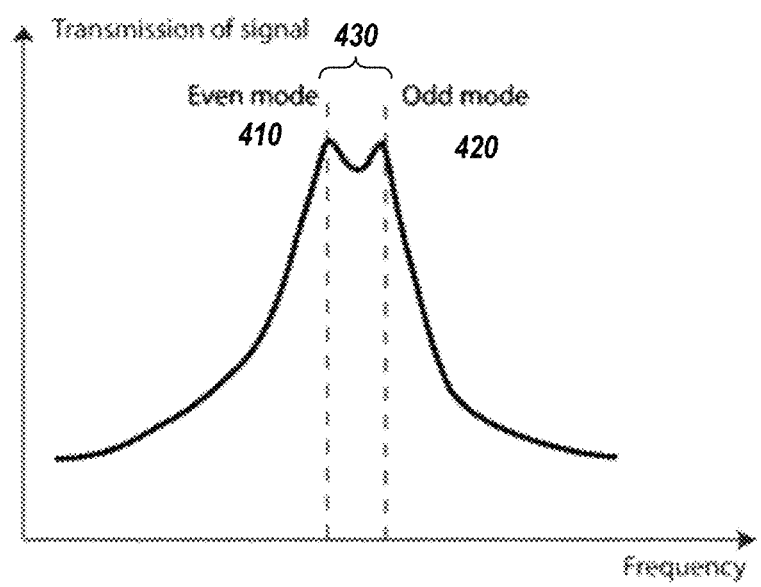
FIG. 4B is an illustrative transmission response of an LBAW as a function of frequency.

FIGS. 4A-4B illustrate the relationship between standing wave resonance modes and the LBAW bandgap. Referring to FIG. 4A, a portion of LBAW 100 includes two adjacent electrodes 401 and 402 with width W (e.g., corresponding to extensions 150a and 170a of respective electrodes 150 and 170 of FIG. 1A). The bandpass frequency response of LBAW 100 is formed by two (or more) laterally standing resonance modes, 410 and 420, arising in the structure. Lateral standing wave resonance can arise when plate waves are reflected from edges of electrodes 401 and 402. In the even mode resonance 410, the piezo layer under both electrodes 150 and 170 vibrates in-phase, whereas in the odd mode resonance 420, the phases are opposite. The even lateral standing wave resonance can arise when the total width of the structure is roughly equal to half of the lateral wavelength $\lambda_\parallel$ of the mode:

$$\frac{\lambda_{even}}{2} = \frac{\lambda_\parallel}{2} \approx 2 \cdot W + G.$$

In the limit of infinitely small gap width G, $\lambda_{even}$ approaches the total width from below. As shown in FIG. 4A, $\lambda_{even}$ gets smaller when G gets larger and gets larger when G gets smaller. In case of small gap (e.g., zero-gap) $\lambda_{even}$ gets close to 4 W and in case of a large gap $\lambda_{even}$ gets close to 2 W. The odd lateral standing wave resonance can arise when the width of the electrode is roughly equal to half of the lateral wavelength $\lambda_\parallel$ of the mode:

$$\frac{\lambda_{odd}}{2} = \frac{\lambda_\parallel}{2} \approx W.$$

Referring to FIG. 4B, the even 410 and odd 420 modes are shown as transmission peaks as a function of input frequency f for an LBAW with Type 1 dispersion. For Type 1 dispersion, even mode 410 has a longer wavelength and is lower in frequency than the shorter-wavelength odd mode 420. The frequency difference 430 between the modes determines the achievable bandwidth of LBAW filter 100, and depends on the acoustic properties of the structure and on the dimensions of IDT resonator 102. Acoustic coupling strength can be defined in terms of the (resonance) frequency difference between even (symmetric) and odd (antisymmetric) resonances:

$$\frac{f_{asymm} - f_{symm}}{f_0},$$

where $f_{symm}$ and $f_{asymm}$ are the symmetric and antisymmetric eigenfrequencies, respectively, and $f_0=(f_{symm}+f_{asymm})/2$ is the center frequency between the two modes.

In some embodiments, increasing the number of extensions (e.g., 150a and 170a) in each electrode (e.g., 150 and 170) can increase the frequency difference between the even and odd mode in the LBAW, and thus increase the bandwidth. This effect can result from the fact that the lateral wavelength of the odd mode can depend on the periodicity of the electrode structure (e.g., width W), while the even mode can depend on the entire width of the structure (e.g., adding up all widths W and gaps G). For example, if the total number of electrode extensions K, the electrode width is W, and the gap width is G, the wavelength $\lambda_\parallel$ of the lateral acoustic wave at the even mode resonance frequency approaches or is slightly shorter than:

$$\frac{\lambda_{even}}{2} \approx K \cdot W + K \cdot G.$$

The odd lateral standing wave resonance in this structure, however, approaches or is slightly larger than:

$$\frac{\lambda_{odd}}{2} \approx W.$$

Additionally, or alternatively, in some embodiments, the total width of the structure K·W+K·G can be such that the highest-order mode trapped in the structure is the desired odd mode resonance. For example, K can be 31, W can be 3 μm, and G can be 2 μm.

In some embodiments, the number of electrode extensions K is between 2 and 200, or between 10 and 60. In some embodiments, the length L of electrode extensions can be between 50 μm and 2000 μm, or between 70 μm and 500 μm.

In some embodiments, the gap G is selected to allow coupling of the evanescent tails of standing waves formed under electrodes 150 and 170. For example, the gap G between electrode extensions can be 0.1 μm and 10 μm, or between 2 μm and 5 μm.

In some embodiments, electrode 150 and 170 topology can be designed such that the gap width G provides good enough coupling between electrode extensions to create a single even mode 410 across the entire width of the structure. For example, the gap width G can be 2%-300%, or 10%-100% of the evanescent acoustic wave's decay length, i.e., the length at which amplitude $A=A_0 \cdot e^{-1}$ of the original amplitude $A_o$, in the gap at the desired even resonance mode. Gap with G can be optimized. Decreasing the gap to a too small width (1) can eventually pull the even and odd modes too far from each other creating a dip in the passband, (2) can lead to reduced coupling coefficient for the odd mode, or (3) can increase capacitive feedthrough from finger to finger causing poor out of band attenuation.

In some embodiments, gap width G can be defined with respect to piezo layer thickness d. For example, G can be designed to be 10% to 300% of d, or 25% to 150% of d.

In some embodiments, the width of electrode extensions W can be between 0.1 μm and 30 μm, or between 2 μm and 5 μm. In some embodiments, W can be designed such that the wavelength $\lambda_\parallel$ of the lateral acoustic wave at the desired odd mode resonance frequency $\lambda_{odd}$ is obtained.

In some embodiments, electrode width W is designed such that multiple half-wavelengths cannot fit within the electrode width. For example, W can be designed to be smaller than the lateral acoustic wave's wavelength $\lambda_\parallel$ at the desired odd resonance mode, e.g., where $\lambda_\parallel = \lambda_{odd}$.

In some embodiments, the thicknesses of various LBAW 100 components can be selected to achieve various acoustic properties and may be interdependent. For example, the piezo layer 110 thickness d (minimum and maximum value) can first be determined with respect to the acoustic wavelength in the piezo material ($\lambda$) at the operation frequency f. In some embodiments, thicknesses (min and max) of the other LBAW 100 layers can be selected based on the choice of piezo thickness d. For example, the combined thickness of the electrodes (including the counter electrode 120) and the piezoelectric layer can be selected to be approximately half a wavelength of the mode that is being used, for example longitudinal bulk wave for the thickness extensional mode. Fundamental modes with N=1 (the first mode, i.e., first harmonic) can allow for greater coupling, but N>1 modes are also possible. For example, the thickness of electrodes 150 and 170, bottom electrode 120, and reflecting structure 130 can be defined as a percentage of piezo layer thickness d. In some embodiments, once all thickness are selected, the geometry of the electrode extensions 150*a* and 170*a*, such as number K, width W, gap G, and length L, can be tuned to match the LBAW 100 electrical impedance to the system impedance. Without wishing to be bound by theory, impedance matching can help avoid losses and reflections in the system.

In some embodiments, thickness of electrodes 150 and 170 is between 1% to 30% of d, or 2% to 25% of d, or 3% to 15% of d.

In some embodiments, the thickness of bottom electrode 120 is between 5% to 50% of d, or 10% to 30% of d, or 10% to 20% of d.

The mass loading of the IDT 102, determined by the thickness and material of electrodes 150 and 170, can be designed such that the frequency difference between the $k_\parallel=0$ frequency of the electrode region's TE1 mode and the outside electrode region's TS2 mode is small. Without wishing to be bound by any particular theory, when the frequency difference between outside region's TS2 mode and electrode region's TE1 mode is small, the trapping range is large. More particularly, the $k_\parallel=0$ frequency of the outside region's TS2 mode can be 95%-99% of the electrode region's TE1 cutoff frequency. The frequency difference between the outside region's TS2 and outside region's TE1 modes' $k_\parallel=0$ frequencies is designed to be large, e.g., 5%-15%, for example 6.5%-7.5%, of the electrode region's TE1 mode cutoff frequency.

According to certain embodiments of the present invention, the $k_\parallel=0$ frequency of the outside region's TS2 mode is greater than, or equal to 98%, or between 98% and 99.5%, or is 98.9% of the electrode region's TE1 cutoff frequency. Similarly, the frequency distance expressed as the frequency difference between electrode region TE1 and outside region TS2 $k_\parallel=0$ frequencies:

$$\frac{\text{electrode } TE1 - \text{outside } TS2}{\text{outside } TS2}$$

should be small, for example on the order of 1%. As an example, said frequency distance can be between 0.2% and 2.1%, or between 0.5% and 1.8%, or between 0.8% and 1.5%, or for example, 1.1%.

Where the reflecting structure 130 is a multi-layer reflector, the alternative layers of the reflector can be designed such that the required reflectivity of passband wavelengths is obtained. For example, the thickness of each layer can be equal to or less or more than one quarter of the acoustic wavelength $\lambda_z$ in the thickness direction to reflect the odd and even TE1 resonance modes. In some embodiments, a single layer in the multi-layer reflector can be 15% to 80% of d, or 20% to 70% of d. However, the multi-layer reflector reflects both TE1 and TS2 modes. In addition, the reflection that a multi-layer reflector provides is not as effective as a gap or cavity in blocking acoustic wave leakage.

Figure 5:
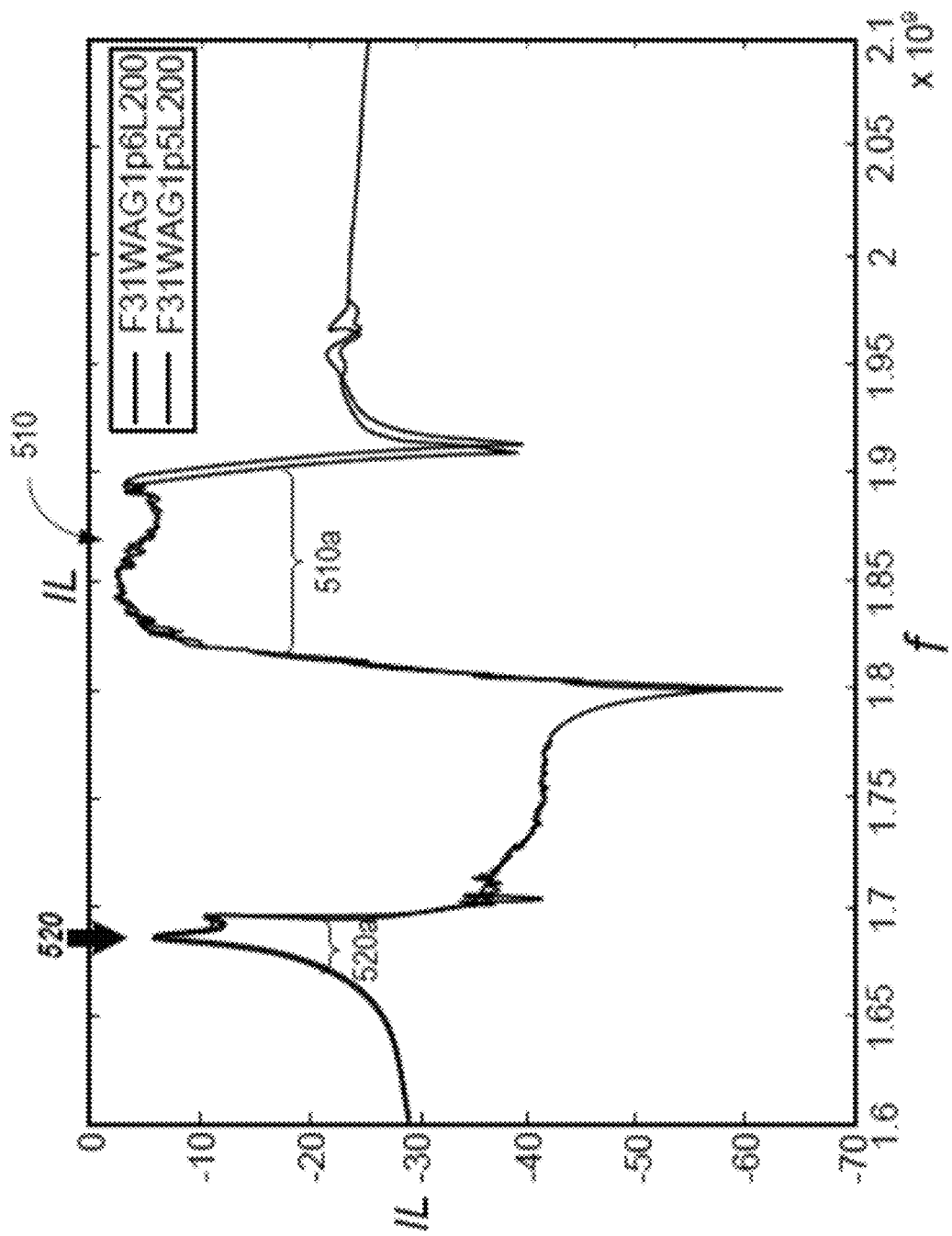
FIG. 5 is an experimental transmission curve of an LBAW as a function of frequency.

FIG. 5 shows a curve of insertion loss IL (in decibels) versus frequency f for an exemplary LBAW 100. The curve shows two passbands with peak 510 corresponding to TE1 waves and peak 520 corresponding to TS2 waves. As discussed above, the width of each passband is determined by the frequency difference of the even and odd modes for the respective type of wave. Here, the TS2 modes correspond to sideband 520*a* (also referred to herein as "TS2 passband"), and the TE1 modes correspond to passband 510*a* (also referred to herein as "TE1 passband"). The LBAW 100 can be designed to suppress peak 520 corresponding to TS2 modes, while maintaining the properties of peak 510 corresponding to TE1 modes. Without wishing to be bound by any particular theory, TE1 mode operation can be selected because piezo thin film materials have electromechanical coupling that is stronger in the thickness direction. In other words, TE1 longitudinal mode vibrations couple more efficiently to the electrical excitation over the thickness of piezo layer 110.

The passband 510*a* is defined between a lower and an upper cutoff frequency. The LBAW 100 can be designed to have a passband for TE1 modes between 0.5 and 10 GHz, or between 1 and 4 GHz. For example, TE1 passband can be between 1.8 and 3.7 GHz. The limits of the passband can incorporate design considerations. For example, the dimensions of the device can grow very large or very small. Too large dimensions may take too much space and cause inefficiencies. Too small dimensions can deteriorate performance due to thin and narrow electrodes leading to resistance and losses. In some embodiments, LBAW 100 can be designed to have a TE1 passband width 510*a* of 0.5-15% relative to center frequency, e.g., 10% relative to center frequency, or 5%, or 2%, or 1%. In some embodiments, the insertion loss at the passband is better than −7 dB, e.g., −7 dB to −0.5 dB or −5 dB to −0.5 dB.

As explained above with respect to FIG. 4B, micro-acoustic resonators can be used as band pass filters. Such a filter can be designed to couple a driving electrical signal to a desired fundamental TE1 mode. An effective coupling results in a passband similar to the TE1 passband of 510a in FIG. 5. The closer to zero the insertion loss is over the passband, the more effectively the band pass filter transmits the energy over the passband. Also, a steep change of insertion loss at the edges of the passband indicate an effective suppression of the energy transmission over the frequencies outside the passband. The present disclosure provides micro-acoustic resonator embodiments that have low insertion loss over their passband and steep change in insertion loss at the edges of their passband.

Figure 6A:
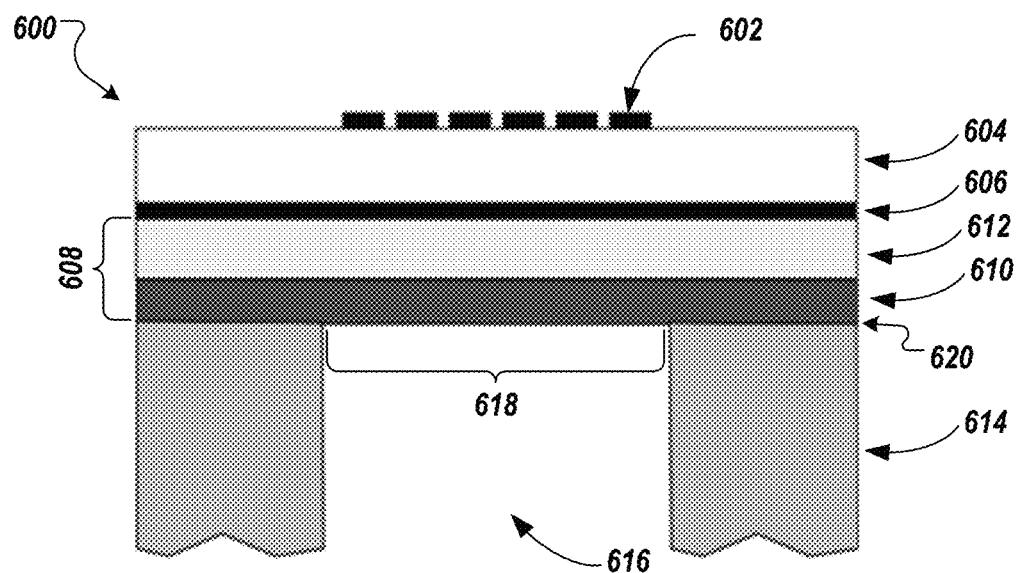
FIGS. 6A-6C depict example micro-acoustic wave devices, according to the implementations of the present disclosure.
Figure 6B:
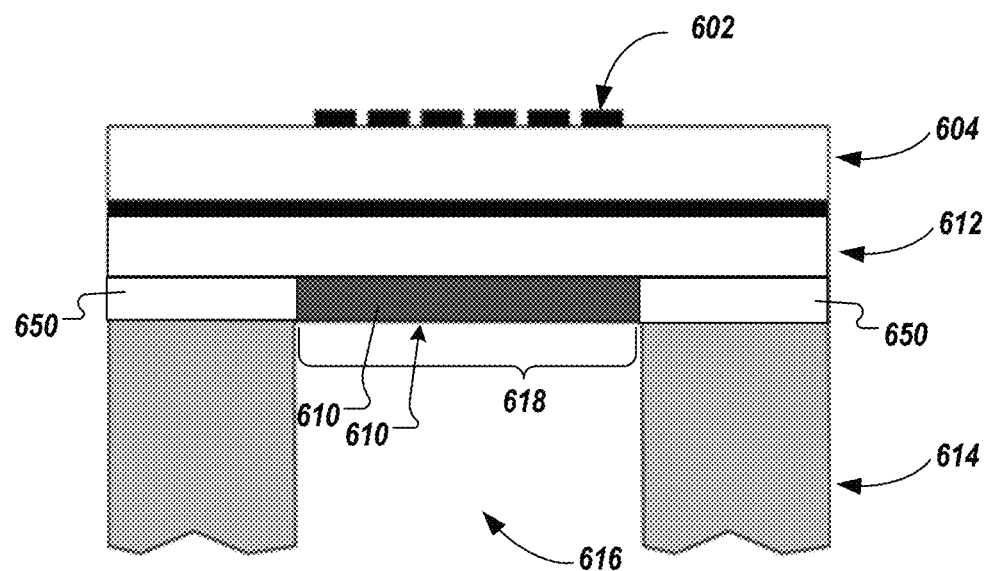
Figure 6C:
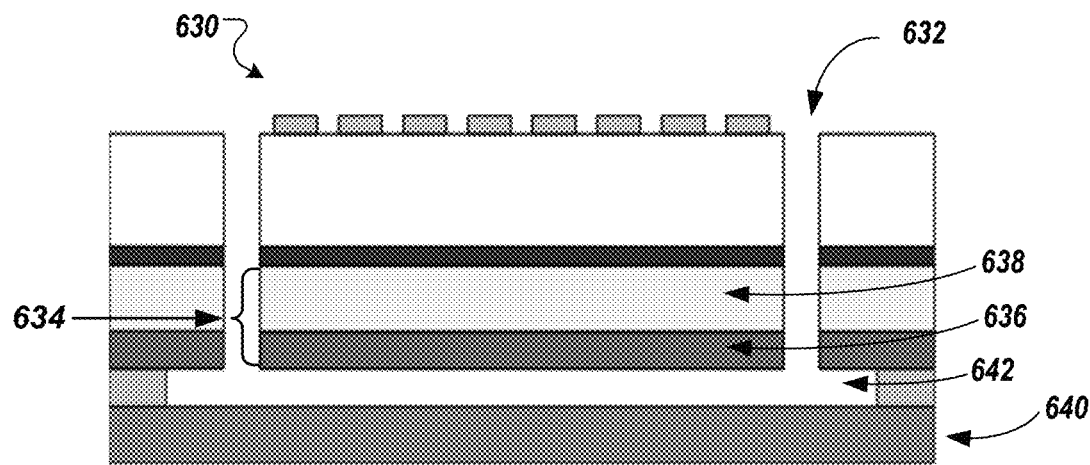

FIG. 6A provides an example micro-acoustic wave filter device according to the present implementations. The micro-acoustic filter device includes an acoustic resonator 600 that has a piezo layer 604. The piezo layer 604 illustrated in FIGS. 6A-6C is sandwiched between one or more electrodes 602 and one or more counter electrodes 606. However, in other implementations, both the electrode and the counter electrode may be on one side (the same side) of the piezo layer (e.g., both on top of the piezo layer). Thus, the acoustic resonator 600 can be any type of acoustic resonator including, but not limited to BAW, SAW, LBAW, and Lamb wave resonators.

The acoustic resonator 600 is located on, e.g., contacting, a bi-layer reflector 608. The bi-layer reflector 608 reflects acoustic waves that escape from the acoustic resonator 600, back into the resonator. In some implementations, the bi-layer reflector 608 reflects back the acoustic waves that have frequencies larger than a lower cutoff frequency of the acoustic resonator 600.

The bi-layer reflector 608 includes a first layer 610 and a second layer 612. In particular, the bi-layer reflector 608 can include only, i.e., consist of, the first layer 610 and the second layer 612. The acoustic impedance of the first layer is higher than the acoustic impedance of the second layer and/or the acoustic impedance of the piezo layer 604. In some examples, the acoustic impedance of the second layer 612 is 90% to 60% lower than the acoustic impedance of the first layer 610. In some examples, acoustic impedance of the second layer 612 is less than half the acoustic impedance of first layer 610.

The first layer 610 can include a material that has a high acoustic impedance, for example, greater than 20e6 kg/m$^2$s. Example materials with high acoustic impedance that can be used in the first layer include, but is not limited to W (with acoustic impedance of about 101e6 kg/m$^2$s), Mo (63.1e6 kg/m$^2$s), Ir, Al2O3 (44.6e6 kg/m$^2$s), diamond (59.8e6 kg/m$^2$s), Pt (69.7e6 kg/m$^2$s), AlN (34e6 kg/m$^2$s), Si3N4 (36.2e6 kg/m$^2$s). Having a high acoustic impedance material as the first layer gives the benefit of avoiding creation of a strong resonance at the bottom most layer of the device and provides a proper reflection of the acoustic waves.

The second layer 612 can include a material that has a low acoustic impedance, for example, less than 20e6 kg/m$^2$s. Example materials with low acoustic impedance that can be used in the second layer 612 include, but is not limited to SiO2 (13.1e6 kg/m$^2$s), glass, Al (17.3e6 kg/m$^2$s), C, or a polymer-based material. Nevertheless, a material with an acoustic impedance higher than 20e6 kg/m$^2$s can be used as the second layer so long as the acoustic impedance of such material is less than a material that is used in the first layer. For example, in a bi-layer, Si with acoustic impedance 20.8e6 kg/m$^2$s can be used in the second layer and W with acoustic impedance of 101e6 kg/m$^2$s can be used in the first layer.

No layer is positioned between the resonator 600 and the bi-layer reflector 608 that significantly modifies the acoustic transmission between the two elements. For example, the counter electrode 606 can be disposed directly on the second layer 612 of the bi-layer reflector 608.

In addition to reflecting the escaped acoustic waves back to the resonator 600, the bi-layer reflector 608 can be leveraged to achieve desired dispersion properties. For example, as explained above with regard to FIG. 3, it is usually desired to have a Type 1 dispersion, which provides a monotonically increasing lateral wave number as a function of the frequency. However, not all piezoelectric materials provide a Type 1 dispersion. For example, AlN provides a Type 2 dispersion.

The bi-layer reflector can be utilized to modify the dispersion of the resonators that are made of the piezoelectric materials that inherently provide a Type 2 dispersion. The dispersion behavior is mostly affected by the layer that is closest to the resonator. Accordingly, regardless of the type of material used in the piezo layer 604, the material and/or thickness of the second layer 612 can be selected such that a combination of the resonator 600 and the bi-layer reflector 608 provide a Type 1 dispersion. For example, an acoustic wave filter that has AlN piezo layer with thickness d, the second layer may include SiO2 and have a thickness of about half d (e.g., between 0.45 to 0.65 of d). For example, the piezo layer may be an AlN layer of 1900 nm to 2100 nm (e.g., between 2000 and 2050 nm) and the second layer may be a SiO2 layer of 800 nm to 1200 nm (e.g., between 950 nm and 1050 nm).

The first layer 610 in FIG. 6A is formed on top of a substrate 614 such that a portion of a first surface 620 of the first layer 610 contacts the substrate 614. The first layer 610 has a floating region 618 that does not contact the substrate. For example, the portion of the first surface 620 corresponding to the floating region 618 can provide the ceiling of a cavity 616. The cavity 616 can be a gap that separates the floating region 618 from the substrate 614, or an aperture that extends entirely through the thickness of the substrate 614 below the floating region 618. The floating region can be vertically aligned with the resonator. For example, the area of the floating region 618 on the surface 620 can span the area that the electrodes 602 occupy on the piezo layer 604's surface. In FIG. 6A, the floating region is on a portion of the first layer that is vertically aligned with the electrodes 602.

Having the gap 616 underneath the floating region reduces the vertical acoustic loss of the resonator by reducing the transmission of acoustic energy into the substrate 614. The gap can be designed to eliminate vertical transmission of the acoustic energy. Since vertical acoustic loss in the direction of the substrate accounts for a significant amount of the acoustic loss in micro-acoustic resonators, the gap 616 can significantly improve the Q-value and the signal transmission over the passband of the acoustic resonator 600. The gap 616 can be created by removing (e.g., by etching) the substrate 614. The cavity can be filled with a gas such as air, one or more noble gases, etc. or can be vacuum.

Accordingly, the arrangement depicted in FIG. 6A improves the functionality of the acoustic resonator 600 by using the single bi-layer 608 that provides the ability to modify the dispersion properties of the resonator 600, and the gap 616 that reduces the vertical acoustic losses to the substrate 614 on top of which the resonator 600 is implemented.

In addition to the vertical acoustic losses, one can reduce the horizontal acoustic losses by forming horizontal reflectors around or at the border of a micro-acoustic resonator. Such horizontal reflectors can reflect the acoustic waves that laterally escape the resonator, back into the resonator. A horizontal reflector can be in form of a frame around the resonator's structure, in form of a periodic set of reflectors, or in form of a structure formed on only particular sides or regions of the border of the resonator's structure. A horizontal reflector can be made of a particular material, or can be in form of a gap or one or more holes. For example, by forming one or more trenches in the piezoelectric layer 604 and about the floating region 618, at least part of the acoustic resonance modes that have propagated laterally can be reflected back into the resonator 600.

The first layer can be supported by the substrate directly or indirectly. The first layer 610 in FIG. 6A is supported by the substrate 614 directly because a part of the first layer is in direct contact with the substrate. FIG. 6B illustrates an example of a device where the first layer is supported by the substrate indirectly. Layer 650 is an intermediate layer that is in direct contact with the first layer and is directly supported by the substrate. Layer 650 can include the same material as the second layer 612, or can be made of a different material. For example, the second layer can be deposited on the substrate and an aperture can be formed by removing part of the substrate and a portion of the second layer on top of it. The first layer 610 can then be deposited within the aperture so that the first layer 610 and the cavity 616 is formed. In this configuration, the floating region forms a substantial part (or all) of the lower surface 620 of the first layer 610.

Figure 7A:
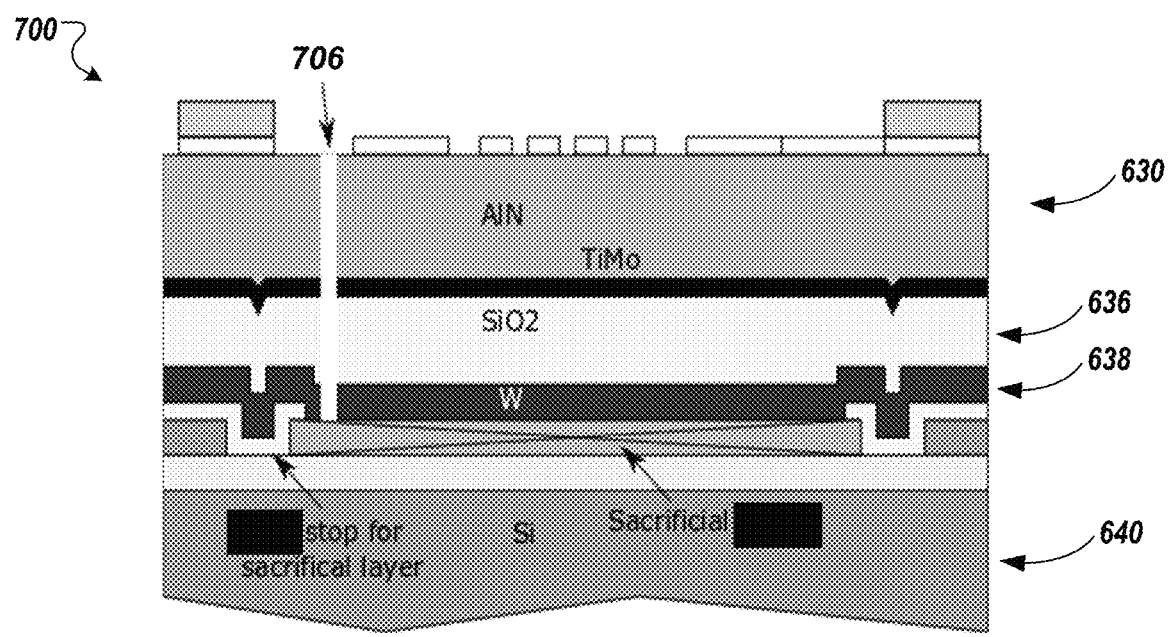
FIG. 7A depicts cross section of an example micro-acoustic structure that includes a sacrificial layer, according to the implementations of the present disclosure.
Figure 7B:
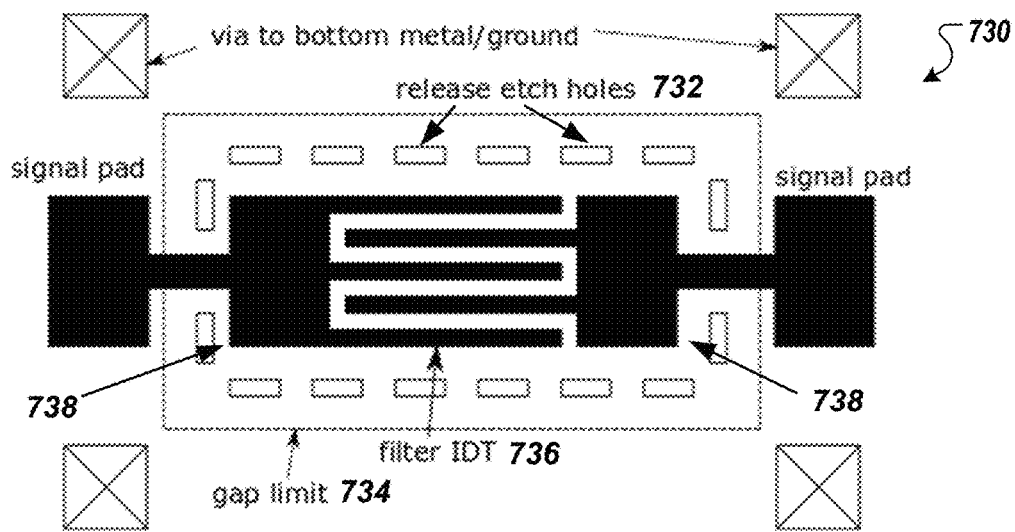
FIG. 7B depicts a top view of a micro-acoustic structure that includes a set of release etch holes, according to the implementations of the present disclosure.

FIG. 6C depicts an example micro-acoustic wave filter device that has one or more trenches 632 around an acoustic resonator 630 for reducing the horizontal acoustic loss of the acoustic resonator 630 (also see FIG. 7B). Although the trench 632 shown in FIG. 6C passes through the first layer 636 and the second layer 638, this is not required. The trenches can extend from the top surface of the piezoelectric layer through one or more of the layers. Thus, alternative implementations with no trench in the first layer and/or the second layer, e.g., where the trench 632 passes through the piezoelectric layer 604 and optionally the counter electrode 606, can also benefit from the reduction of the horizontal acoustic losses.

Similar to the resonator 600 in FIG. 6A, the resonator 630 in FIG. 6C is on top of a bi-layer reflector 634 that includes a high acoustic impedance layer as a first layer 636 and a low acoustic impedance layer as a second layer 638. The bi-layer 634 is separated from the substrate 640 by a gap 642. More specifically, the bi-layer 634 has no direct contact with the substrate 640 and is acoustically isolated from the substrate 640. Due to such isolation, the device depicted in FIG. 6C is expected to have an even less vertical acoustic loss than the device depicted in FIG. 6A. The gap can be filled with a gas such as air, one or more noble gases, etc. or can be vacuum.

To form the gap 642 between the substrate and the first layer 636, a sacrificial layer (also referred to as "intermediary layer," herein) can be formed on top of the substrate 640 and can be removed at a later time after forming the first layer 636. In such case, the first layer 636 is formed (e.g., deposited) on top of the sacrificial layer. The sacrificial layer can be removed through one or more release etch vents or holes before or after the deposition of the second layer 638 and/or the resonator 630 on top of the first layer 636. The sacrificial layer can be made of SiO2, polysilicon, or other materials that can support the fabrication of a stack of layers on its top and can be removed from underneath the stack of layers.

FIG. 7A depicts a cross section of an example micro-acoustic structure 700 that includes a sacrificial layer 702. The micro-acoustic structure 700 can be an example device that has one or more of the layers illustrated in FIG. 6C. The materials used in the micro-acoustic structure 700 are provided as example materials and can be replaced with alternative materials.

FIG. 7A also depicts a release vent 706, a sacrificial layer 702 and one or more remove stops 704. The sacrificial layer 702 can be removed from the structure through the release vent 706, for example, through an etching process. For example, the sacrificial layer 702 may be made of polysilicon material that can be etched by XeF2. Removing the sacrificial layer 702 provides a gap (e.g., gap 642) between the first layer 636 and the substrate 640.

To fabricate the structure 700, the sacrificial layer 702 is formed (e.g., deposited) on top of the substrate 640 or on top of one or more layers that cover the substrate 640 (e.g., a layer of Al2O3). One or more remove stops (e.g., etch stops) 704 can be formed on the substrate to limit the area of the sacrificial layer 702 and the gap that will be formed upon removing the sacrificial layer. The first layer 636, the second layer 638, and the layers of a micro-acoustic resonator (i.e., the piezo, electrode, and counter electrode layers) are respectively formed on top of the sacrificial layer 702. The release vent 706 may be formed by removing a part of the materials that are on top of the sacrificial layer 702 to form a trench that passes through the resonator, the second layer 638, and the first layer 636 to the sacrificial layer 702.

In addition to providing a way to remove the sacrificial layer 702, the release vent 706 can be configured to reduce the horizontal acoustic loss of the resonator 630, as well. For example, the trench 632 depicted in FIG. 6C can be used as a release vent. However, a release vent does not necessarily have to be designed (e.g., be located in a location of the structure 700) to target reducing the horizontal acoustic losses. Likewise, a trench (that is designed to reduce acoustic losses) does not necessarily have to pass through the layers of a micro-acoustic structure to reach a sacrificial layer and act as a release trench. For example, a trench may pass through only the piezoelectric layer of a micro-acoustic resonator to reduce the horizontal acoustic losses without reaching the first layer or the sacrificial layer.

The release vent can form a plurality of trenches (or holes) around the resonator. The trenches 632 and/or release vents 706 can be placed at regular periodic intervals, or at pseudo-random intervals, around the resonator. Portions of the layers that are above the gap 642 but are not etched to form trenches 632 and/or release vents 706 can provide struts to laterally connect the resonator 630 to the remainder of the device.

FIG. 7B depicts a top view of a micro-acoustic filter structure 730 that includes a set of release etch holes 732 formed around a micro-acoustic resonator. The micro-acoustic resonator includes a filter IDT 736 and electrodes 738. The set of etch holes in 732 are arranged in a periodic fashion. The etch holes 732 are used to etch a sacrificial layer below the resonator and can also be used to reduce the horizontal acoustic loss of the resonator. Once the sacrificial layer is etched, a gap is formed below the resonator. A dashed line labeled as the gap limit 734 illustrates the area of the gap under the resonator.

Figure 7C:
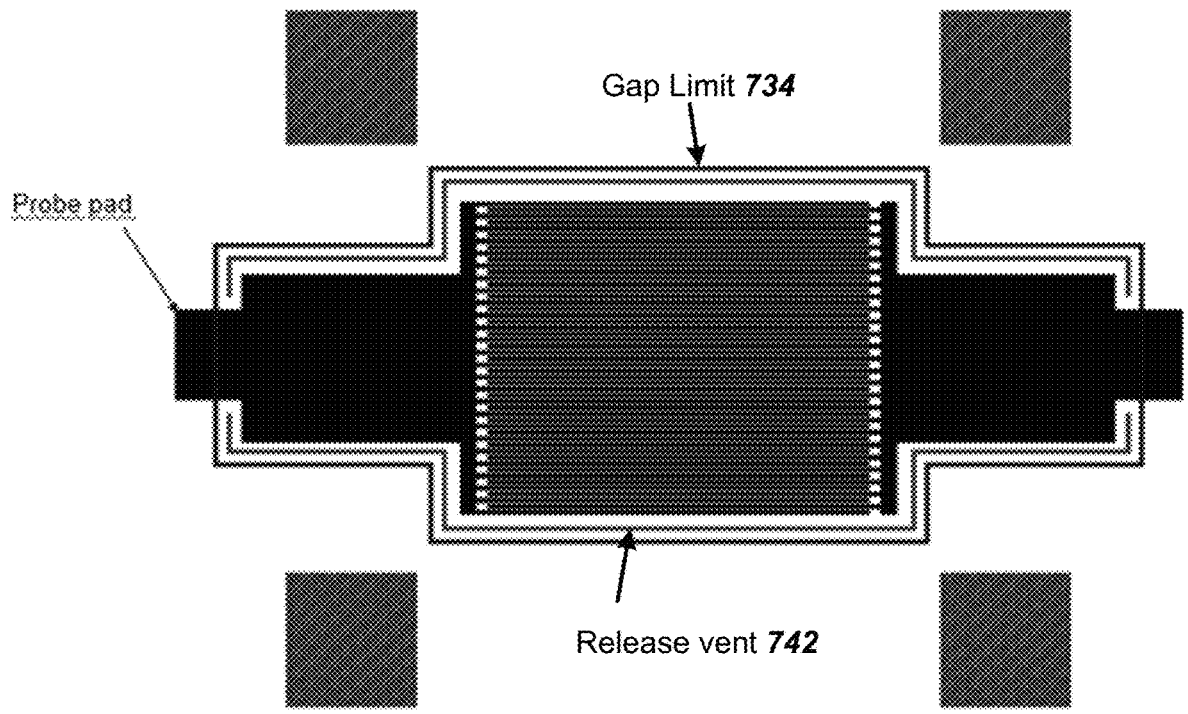
FIG. 7C depicts a top view of a micro-acoustic structure that includes a continuous release etch vent, according to the implementations of the present disclosure.

The release vent can be continuous or in form of a group of apertures. FIG. 7C illustrates a top view of a micro-acoustic filter structure with a continuous vent 742. Alternatively, the release vent can have one or more discontinuities. For example, the etch holes 732 in FIG. 7B are discontinuous as the holes are separated from each other.

Alternatively or in addition to the structures explained above, a bi-layer reflector can be provided on top of a micro-acoustic resonator. Such an upper bi-layer reflector can be symmetrical or asymmetrical to the described bi-layer reflector that is below the resonator. For example, a low acoustic impedance layer can be formed on top of the electrodes 620 of the resonator 600 (not shown in FIG. 6A) and a high acoustic impedance layer can be formed on top of the low acoustic impedance layer. Such arrangement can allow further modification of the dispersion properties of the micro-acoustic device.

A number of implementations have been described. Nevertheless, it will be understood that various modifications may be made without departing from the spirit and scope of disclosure. For example, the implementations can be used in a variety of micro-acoustic resonators including, but not limited to BAW, LBAW, and SAW resonators, Lamb wave devices, and guided wave devices. Accordingly, other implementations are within the scope of the following claims.

What is claimed is:

1. An acoustic wave filter device comprising:
   a substrate;
   a bi-layer reflector above the substrate, the bi-layer reflector including
      a first layer that has a first acoustic impedance, the first layer having a first surface comprising a floating region that provides a ceiling of a cavity, and
      a second layer on top of the floating region of the first layer, the second layer having a second acoustic impedance that is lower than the first acoustic impedance; and
      a planar acoustic wave resonator on top of the second layer of the bi-layer reflector and in parallel to a top layer of the substrate, the acoustic wave resonator comprising a piezoelectric layer, an electrode and a counter-electrode such that application of a radio frequency voltage between the electrode and the counter-electrode creates acoustic resonance waves in the piezoelectric layer,
   wherein the bi-layer reflector is designed to cause a monotonic dispersion behavior for the device such that a lateral wave number of the device increases monotonically as a function of frequency for frequencies greater than a particular frequency.

2. The device of claim 1, wherein the first surface of the first layer further comprises a supported region that is on the substrate.

3. The device of claim 1, wherein the first layer is indirectly supported by the substrate.

4. The device of claim 1, wherein the bi-layer reflector is configured to reflects at least part of the acoustic resonance waves that propagated out of the piezoelectric layer back to the acoustic wave resonator, and
   wherein the cavity blocks propagation of at least part of the acoustic resonance waves to the substrate.

5. The device of claim 4, wherein the bi-layer reflector is configured to reflect back acoustic waves that have frequencies greater than a cutoff frequency of a passband of the acoustic wave resonator.

6. The device of claim 1, wherein the cavity completely blocks propagation of a portion of the acoustic resonance waves that are propagated from the acoustic wave resonator towards the cavity.

7. The device of claim 1, wherein the first layer is acoustically isolated from the substrate.

8. The device of claim 1, further comprising one or more trenches in the piezoelectric layer and positioned laterally outward of the electrodes of the resonator, the one or more trenches being configured to reflect at least part of the acoustic resonance waves that have laterally propagated out of the piezoelectric layer.

9. The device of claim 1, wherein the acoustic wave resonator is selected from the group consisting of a bulk acoustic wave (BAW) resonator, a surface acoustic wave (SAW) resonator, a lateral bulk acoustic wave (LBAW) resonator, and a Lamb wave resonator.

10. The device of claim 1, wherein the second acoustic impedance is 60% to 90% lower than the first acoustic impedance.

11. The device of claim 1, wherein the piezoelectric layer comprises a material selected from a group consisting of: AlN, ScAlN, LiTaO3, LiNbO3, ZnO, and GaN.

12. The device of claim 1, wherein the first layer comprises a material selected from a group consisting of: W, Mo, Ir, Al2O3, diamond, Pt, AlN, Si3N4, and Os (Osmium).

13. The device of claim 1, wherein the second layer comprises a material selected from a group consisting of: SiO2, glass, Al, Ti, C, and a polymer-based material.

14. The device of claim 1, wherein the first acoustic impedance of the first layer is greater than 20 e6 $kg/m^2s$.

15. A method of fabricating an acoustic wave filter device, the method comprising:
   depositing an intermediary layer on top of a substrate;
   forming a first layer on top of the intermediary layer, the first layer having a first acoustic impedance;
   forming a second layer on top of the first layer, the second layer having a second acoustic impedance that is lower than the first acoustic impedance;
   forming a planar acoustic wave resonator on top of the second layer and in parallel to a top layer of the substrate, the acoustic wave resonator comprising a piezoelectric layer, an electrode and a counter-electrode such that application of a radio frequency voltage between the electrode and the counter-electrode creates acoustic resonance waves in the piezoelectric layer;
   removing the intermediary layer to form a gap between the first layer and the substrate layer such that the gap blocks propagation of at least part of the acoustic resonance waves out of the acoustic wave resonator to the substrate,
   wherein a combination of the first and the second layers cause a monotonic dispersion behavior for the device such that a lateral wave number of the device increases monotonically as a function of frequency for frequencies greater than a particular frequency.

16. The method of claim 15, wherein removing the intermediary layer comprises etching the intermediate layer.

17. The method of claim 16, further comprising forming one or more release vents that pass through the acoustic wave resonator, the second layer, and the first layer, wherein the intermediary layer is etched through the one or more release vents.

18. The method of claim 15, wherein the gap completely blocks propagation of a portion of the acoustic resonance waves that are propagated from the acoustic wave resonator towards the gap.

19. A method of fabricating an acoustic wave filter device, the method comprising:
- forming a first layer that has a first acoustic impedance on top of a substrate such that the first layer covers a first region of the substrate;
- forming a second layer on top of the first layer, the second layer having a second acoustic impedance that is lower than the first acoustic impedance;
- forming a planar acoustic wave resonator on top of the second layer and in parallel to a top layer of the substrate, the acoustic wave resonator comprising a piezoelectric layer, an electrode and a counter-electrode such that application of a radio frequency voltage between the electrode and the counter-electrode creates acoustic resonance waves in the piezoelectric layer;
- removing at least part of the first region of the substrate that is covered by the first layer to form a gap between the first layer and the substrate,
- wherein a combination of the first and the second layers cause a monotonic dispersion behavior for the device such that a lateral wave number of the device increases monotonically as a function of frequency for frequencies greater than a particular frequency.

20. The method of claim 19, further comprising forming one or more release vents that pass through the acoustic wave resonator, the second layer, and the first layer, wherein the at least part of the first region of the substrate is removed through the one or more release vents.

* * * * *